(12) United States Patent
Chang

(10) Patent No.: US 8,039,836 B2
(45) Date of Patent: Oct. 18, 2011

(54) SEMICONDUCTOR DEVICE

(75) Inventor: Chienliu Chang, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/948,683

(22) Filed: Nov. 17, 2010

(65) Prior Publication Data

US 2011/0062439 A1    Mar. 17, 2011

Related U.S. Application Data

(63) Continuation of application No. 12/063,430, filed on Feb. 8, 2008, now abandoned.

(30) Foreign Application Priority Data

Sep. 6, 2005    (JP) .................................. 2005-258269

(51) Int. Cl.
*H01L 29/10* (2006.01)
(52) U.S. Cl. ................... 257/43; 349/158; 257/E29.296
(58) Field of Classification Search .................... 257/48, 257/43, E29.296; 349/158
See application file for complete search history.

(56) References Cited

U.S. PATENT DOCUMENTS

| 5,879,741 | A | 3/1999 | Itoh |
| 6,649,980 | B2 | 11/2003 | Noguchi |
| 7,005,164 | B2 | 2/2006 | Momoi et al. |
| 7,368,766 | B2 | 5/2008 | Kamiyama et al. |
| 2002/0102821 | A1 | 8/2002 | Voutsas |
| 2005/0059777 | A1* | 3/2005 | Doi .............................. 525/54.23 |
| 2006/0043579 | A1* | 3/2006 | He et al. ........................ 257/712 |

FOREIGN PATENT DOCUMENTS

| JP | 64-48462 | 2/1989 |
| JP | 6-280026 | 10/1994 |
| JP | 2001-305526 A | 10/2001 |
| JP | 2002-76356 | 3/2002 |
| JP | 2002-184993 | 6/2002 |
| WO | 2004/038757 | 5/2004 |

OTHER PUBLICATIONS

Kenji Nomura, et al., "Room-temperature fabrication of transparent flexible thin-film transistors using amorphous oxide semiconductors", Nature, vol. 432, Nov. 25, 2004, pp. 488-492.
European Office Action dated Mar. 8, 2011 in corresponding European Patent Application No. 06783131.3.

* cited by examiner

*Primary Examiner* — Zandra Smith
*Assistant Examiner* — Ali Naraghi
(74) *Attorney, Agent, or Firm* — Fitzpatrick, Cella, Harper & Scinto

(57) ABSTRACT

In the present invention, a thin film transistor is formed on a plastic film substrate (1) having anisotropy of thermal shrinkage rate or coefficient of thermal expansion in in-plane directions of the substrate. A channel is formed such that the direction (7) in which the thermal shrinkage rate or the coefficient of thermal expansion of the substrate is largest is nonparallel to the direction (8) of a current flowing through the channel of the thin film transistor. Then, a thin film transistor having stable and uniform electrical characteristics, which is formed on the plastic film substrate, is provided.

7 Claims, 7 Drawing Sheets

SEMICONDUCTOR DEVICE

This application is a continuation of U.S. application Ser. No. 12/063,430, filed Feb. 8, 2008, now abandoned, the contents of which are incorporated herein by reference.

TECHNICAL FIELD

The present invention relates to a semiconductor device formed on a substrate having anisotropy of thermal shrinkage rate or coefficient of thermal expansion in in-plane directions of the substrate.

BACKGROUND ART

In recent years, light-emitting devices, display panels, and the like which are placed on a substrate which is flexible and light-weight have been under active research and development. For example, a thin film transistor (TFT) in which a transparent conductive oxide polycrystalline thin film containing ZnO as main material is used as a channel layer has been actively developed (see Japanese Patent Application Laid-Open No. 2002-76356).

The thin film can be formed at low temperature and is transparent to visible light, so it makes possible a flexible transparent TFT to be formed on a substrate such as a plastic plate or a film.

On the other hand, a thin film formed on a film-shaped flexible substrate by a vapor phase method has been a problem that the substrate is warped by residual stress present in the thin film. As a means for solving this problem, a method by bending the substrate during the film formation process to cancel or compensate the residual internal stress is proposed (Japanese Patent Application Laid-Open No. H06-280026).

DISCLOSURE OF THE INVENTION

An object of the present invention is to provide a semiconductor device with stable semiconductor device characteristics, which is formed on a substrate having anisotropy of thermal shrinkage rate or coefficient of thermal expansion in in-plane directions of the substrate and a method of manufacturing the semiconductor device.

When a flexible substrate such as a plastic plate or a resin film is used, factors with respect to warpage of a thin film lamination including the substrate, change in size which is caused by, for example, thermal shrinkage or thermal expansion, and residual stress are adversely influenced for the device on it. In particular, when a plastic film obtained by melt-processing a thermoplastic resin into a sheet shape and biaxially stretching the thermoplastic resin in longitudinal and transverse directions is used as the substrate, the adverse influence may be significant. This is due to that the thermal shrinkage rate or the coefficient of thermal expansion varies in the in-plane directions due to the biaxial stretching process. For example, a change in size of the substrate makes the semiconductor device formed on it a change in the path length or width of the current flow, a change in the piezo-resistance of the semiconductor, or the like. Therefore, a fabricated device would be different from its original design. For example, when a thermally-shrunk substrate shortens a channel between a drain and a source, a parasitic capacitance becomes larger or a cutoff frequency reduces.

In general, a semiconductor device manufacturing process includes numbers of high-temperature processes. That is, each of the processes includes a temperature cycle in which room temperature is changed to high temperature and the high temperature is changed to room temperature. Therefore, the substrate having the anisotropy of thermal shrinkage rate or coefficient of thermal expansion in the in-plane directions is expanded and shrunk by the temperature cycle, thereby changing a size of the substrate. Thus, change in size, deformation, internal distortion, and stress of the semiconductor device are influenced, so that the characteristics of the semiconductor device are adversely influenced as described above.

The present invention is used to suppress the influence of the change in size, deformation, internal distortion, stress, or the like of the semiconductor device by elaborately designing a layout with respect to the direction of the current flowing through the semiconductor device on the substrate.

Hereinafter, the present invention will be specifically described.

According to one aspect of the present invention, there is provided a semiconductor device formed on a surface of a substrate having anisotropy of thermal shrinkage rate or coefficient of thermal expansion in an in-plane directions of the substrate, characterized in that the direction in which the thermal shrinkage rate or the coefficient of thermal expansion of the substrate is largest is nonparallel to the direction of a current flowing through the semiconductor device.

According to another aspect of the present invention, there is also provided a semiconductor device formed on a surface of a substrate having anisotropy of thermal shrinkage rate or coefficient of thermal expansion in an in-plane directions of the substrate, characterized in that a direction in which the thermal shrinkage rate or the coefficient of thermal expansion of the substrate is smallest is parallel to the direction of a current flowing through the semiconductor device.

In the present invention, the semiconductor device includes a generally-known electrical device such as a MOSFET, a thin film transistor (TFT), an ultraviolet sensor, a solar battery, or an ion sensitive transistor.

According to the present invention, an adverse effect caused by thermal shrinkage or thermal expansion can be avoided. As a result, it is possible to achieve uniform and high stability of the semiconductor device, long life thereof, and improvement of yield thereof.

Other features and advantages of the present invention will be apparent from the following description taken in conjunction with the accompanied drawings, in which reference characters represent the same or similar parts throughout the figures thereof.

BRIEF DESCRIPTION OF THE DRAWINGS

The accompanied drawings, which are incorporated in and constitute a part of the specification, illustrate embodiments of the invention and, together with the description, serve to explain the principles of the invention.

BEST MODE FOR CARRYING OUT THE INVENTION

In recent years, a thin film transistor using an In—Ga—Zn—O amorphous oxide for a channel layer has been reported (K. Nomura et. al, Nature, Vol. 432, pp. 488-492, November 2004, the U.K.). This transistor can be formed on a plastic or glass substrate at room temperature. The field-effect mobility is approximately 6 to 9 cm$^2$ V$^{-1}$ s$^{-1}$, so that a normally-off transistor can be obtained.

As a result of aggressive advanced research and development on a film containing In, Ga, Zn, and O and its growth conditions related thereto, the inventors of the present invention developed a transparent oxide film including microcrystals having an electron carrier concentration of lower than 10$^{18}$/cm$^3$ under a condition of an oxygen atmosphere at film formation. Then, the inventors succeeded in manufacturing a TFT using the transparent semiconductive oxide amorphous thin film as the TFT channel layer. The transparent semiconductive oxide film is a transparent amorphous oxide film which contains In, Ga, Zn, and O. The composition of the oxide film at crystalline state is expressed by InGaO$_3$(ZnO)$_m$ (m is a natural number smaller than 6). Microcrystals are included in the oxide film. The electron carrier concentration is lower than 10$^{18}$/cm$^3$. The inventors also succeeded in manufacturing a semiconductor device using a film containing In, Ga, Zn, and O on a plastic film.

The semiconductor device including the thin film transistor can be applied to a semiconductor device formed on a substrate surface of a substrate having anisotropy of thermal shrinkage rate or coefficient of thermal expansion in in-plane directions of the substrate.

The present invention is not necessarily limited to the above-mentioned thin film transistor. Such thin film transistor can be formed on a plastic film substrate at room temperature, so that the present invention can be suitably used. Therefore, an example in which a TFT using the amorphous transparent oxide thin film as the channel layer is formed on a plastic film substrate will be described as a preferred embodiment of the present invention. Another example of the thin film transistor used for the present invention is a TFT in which a transparent conductive oxide polycrystalline thin film containing ZnO as a main material is used as the channel layer.

Figure 1:
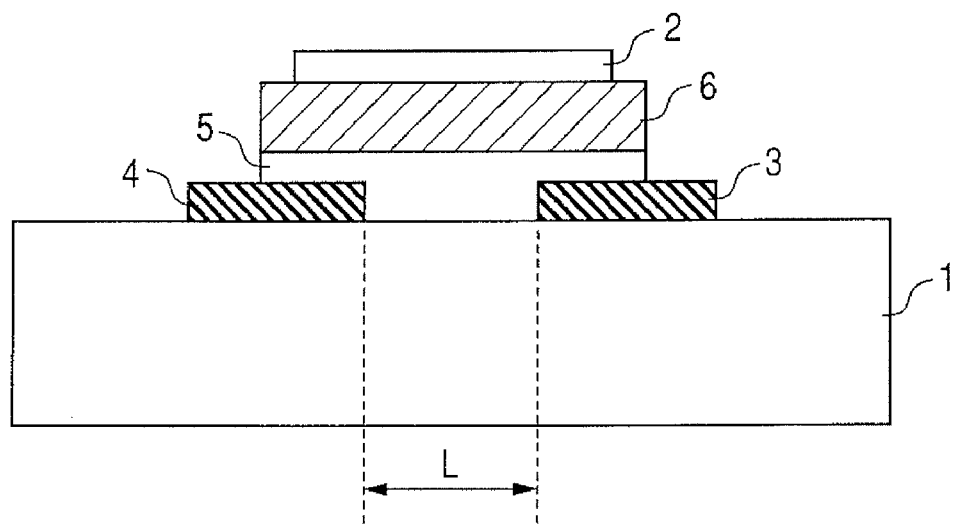
FIG. 1 is a cross sectional view showing a top gate TFT according to an embodiment and Example 1 of the present invention in which an amorphous In—Ga—Zn—O thin film formed on a plastic film substrate is used for a channel.
Figure 2:
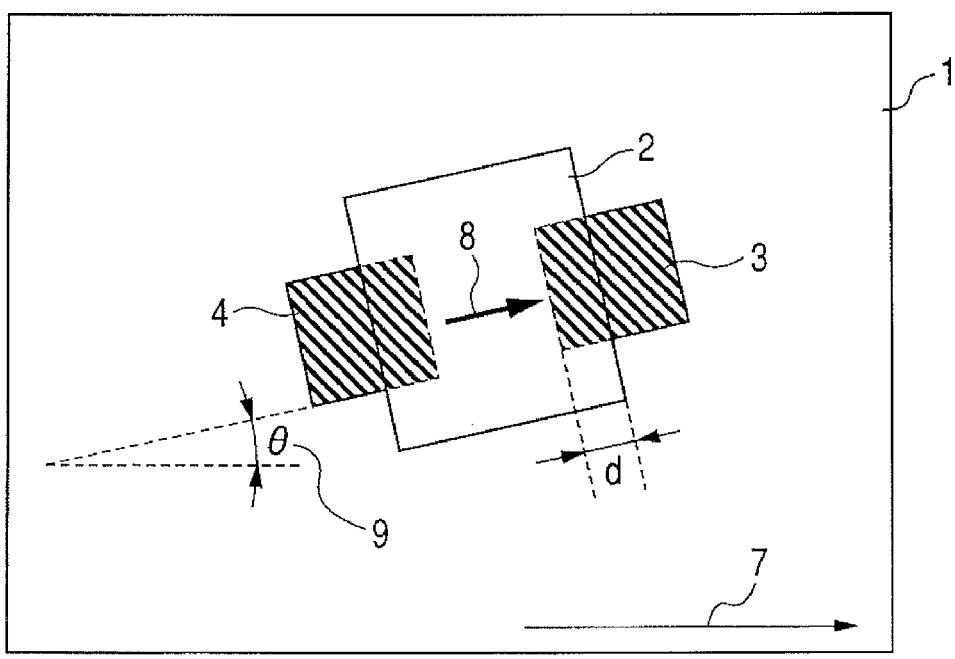
FIG. 2 is a top view showing the TFT according to the embodiment and Example 1 of the present invention.

FIG. 1 is a cross sectional view of a top gate TFT device in which an amorphous In—Ga—Zn—O thin film formed on a plastic film substrate is used as the channel layer. FIG. 2 is a top view of the TFT device.

The anisotropy of thermal shrinkage rate or coefficient of thermal expansion of the film substrate in in-plane directions thereof can be determined using measurement data supplied from the film maker or measurement data obtained by users. As the measurement method, a mechanical or optical method is known.

As shown in FIG. 2, a drain electrode and a source electrode is patterned on a surface of a film substrate 1 by a photolithography method such that an angle formed between the direction 7 (indicated by an arrow in FIG. 2) in which the thermal shrinkage rate or the coefficient of thermal expansion of the substrate 1 is largest and the direction 8 (indicated by a thick arrow in FIG. 2) of a current flowing in the channel of the TFT device is set to be an angle θ (reference numeral 9 denotes the angle θ in this drawing). After that, a drain electrode 4 and a source electrode 3 are formed by a lift-off method. That is, the direction of the current flowing in the channel (direction of the current flowing between the drain electrode and the source electrode) is determined to form the channel. Note that there is possible that the position of the drain electrode 4 and that of the source electrode 3 are reversed to each other (current flow direction is reversed in this case).

As a result of the manufacturing process, when the angle θ is 0°, the on-current $I_{DS}$ flowing through the TFT device is 1.69×10$^{-4}$ A. Note that the on/off ratio of the TFT device exceeds 3×10$^5$.

The angle θ is set as appropriate to a value which exceeds 0° and is equal to or smaller than 90°. The angle θ is the angle formed between the direction in which the thermal shrinkage rate or the coefficient of thermal expansion of the substrate is largest and the direction of the current flowing in the channel of the semiconductor device.

For a semiconductor device formed on a substrate having anisotropy of thermal shrinkage rate or coefficient of thermal expansion in the in-plane directions of the substrate, the direction in which the thermal shrinkage rate or the coefficient of thermal expansion of the substrate is largest is made nonparallel to the direction of a current flowing in a channel formed in the semiconductor device, so that the on-current increases.

In the present invention, it is only necessary that the angle θ formed between the direction in which the thermal shrinkage rate or the coefficient of thermal expansion of the substrate is largest and the direction of the current flowing in the channel formed in the semiconductor device be such that these two directions are nonparallel (only the exception of the case of θ=0). The angle is preferably 45° or larger and 90° or smaller. The angle is more preferably 60° or larger and 90° or smaller. The angle is optimally 80° or larger and 90° or smaller. As described above, when the angle formed between the direction in which the thermal shrinkage rate or the coefficient of thermal expansion of the substrate is largest and the direction of the current flowing in the channel formed in the semiconductor device is set such that these two directions become nonparallel, the mobility of the TFT device can be increased, and the S-value of a sub-threshold slope characteristics (hereinafter referred to as just "S-value") is reduced. In examples described later, when the angle is 45° compared to 0° and when the angle is 90° compared to 45°, the mobility of the TFT device can be much increased, and the S-value can be further reduced. When the case of 90° is compared with the case of 0°, the mobility of the TFT device can be increased by approximately 30% and the S-value can be reduced by approximately 60%. Therefore, the improvement of the transistor characteristics, for example, an increase in switching speed can be achieved.

When the angle formed between the direction of the current flowing in the channel formed in the semiconductor device and the direction in which the thermal shrinkage rate or the coefficient of thermal expansion of the substrate is largest is closer to 90°, the mobility of the TFT device can be further increased, and the S-value can be reduced. This is because, when the angle is closer to 90°, the angle is closer to the angle in which the thermal shrinkage rate or the coefficient of thermal expansion of the substrate is smallest. Thus, it is preferable that the direction in which the thermal shrinkage rate or the coefficient of thermal expansion of the substrate is smallest and the direction of the current flowing through the semiconductor device be made substantially parallel to each other (to a parallel or nearly parallel state). The directions are optimally made parallel to each other. Here, the parallel or nearly parallel state means that the angle formed between the direction in which the thermal shrinkage rate or the coefficient of thermal expansion of the substrate is smallest and the direction of the current flowing through the semiconductor device is 0° or larger and 30° or smaller.

When the substrate with anisotropy of thermal shrinkage rate or coefficient of thermal expansion in the in-plane directions of the substrate has a plurality of directions, each of which is the direction in which the thermal shrinkage rate or the coefficient of thermal expansion of the substrate is largest (for example, a case where the thermal shrinkage rate or the coefficient of thermal expansion is largest in each of a longitudinal direction and a transverse direction), it is only necessary to set the direction of the current flowing through the semiconductor device to be nonparallel to the plurality of directions.

When a transparent oxide semiconductor film such as a film composed of a compound In—Ga—Zn—O is formed, stress is generated therein in many cases, which leads to occurrence of crystallization, change in orientation, occurrence of cracks, or the like. In particular, when the film is formed on a substrate having anisotropy of thermal shrinkage rate or coefficient of thermal expansion in the in-plane directions thereof, such as a plastic substrate, the stress generated in the oxide semiconductor film may change the amorphous properties of the oxide semiconductor film or influence the piezoelectric resistance and fatigue characteristics of the film.

However, when the angle formed between the direction in which the thermal shrinkage rate or the coefficient of thermal expansion of the substrate is largest and the direction of the current flowing in the channel formed in the semiconductor device is adjusted in a suitable range, manufacturing yield of a group of TFT devices can be significantly improved. This is important particularly in the case of a large-size substrate.

It is preferable that a substrate whose thermal shrinkage rate is 0.01% or larger and 9% or smaller in a conduction of 30 minutes and 150° C. be used as the above-mentioned polymer resin substrate.

It is preferable that a substrate whose coefficient of thermal expansion is $5 \times 10^{-6}$ or larger and $1 \times 10^{-5}$ or smaller be used as the above-mentioned polymer resin substrate.

It is preferable that a substrate having a thickness of 25 micron and a dielectric breakdown voltage of 6 KV or larger be used as the above-mentioned resin substrate.

According to a preferred mode, a maximum temperature in each manufacturing process for the semiconductor device is set to 50° C. or higher and 300° C. or lower. When a plastic film is to be used as the substrate, it is preferable that a substrate temperature be maintained to be lower than 200° C.

The thermoplastic resin substrate described above is desirably made of at least one kind of a thermoplastic resin selected from the group consisting of triacetate, diacetate, cellophane, polyether sulfone, polyetherether sulfone, polysulfone, polyether imide, polycarbonate, polyester, polyvinyl alcohol, polyarylate, polymethyl methacrylate, vinylidene fluoride, polystyrene, an AS resin, an ABS resin, polyethylene, polypropylene, a vinyl chrolide resin, a methacrylate resin, polyethylene terephthalate, polyethylene naphthalate, polyamide, polyacetal, modified polypheylene ether, polybutylene terephthalate, polypheylene sulfide, polyamideimide, polyimide, polyphtalamide, a cyclic polyolefin polymer, a cycloolefin polymer, polyetherether ketone, and a liquid crystal polymer.

A film substrate obtained by melt-processing a thermoplastic resin in a sheet shape and biaxially stretched the thermoplastic resin in both longitudinal and transverse directions can be used as the thermoplastic resin substrate.

The thin film transistor (TFT) includes a gate terminal, a source terminal, and a drain terminal. The TFT is an active device in which a semiconductor thin film formed on a dielectric substrate made of ceramic, glass, plastic, or the like is used as a channel layer through which electrons or holes move and has a function for controlling a current flowing in the channel layer between the source terminal and the drain terminal corresponding to the voltage applied to the gate terminal.

The TFT device which can be used here is, for example, a device having a stagger (i.e., top gate) structure in which a gate dielectric film and then a gate terminal are formed on a semiconductor channel layer in this order or a device having a reverse stagger (i.e., bottom gate) structure in which a gate dielectric film and then a semiconductor channel layer are formed on a gate terminal in this order.

An active layer of the semiconductor device can be formed by a thin film forming method selected from the group consisting of a sputtering method, a deposition method, a CVD method, an epitaxial growth method, a light-induced deposition method, a pulse laser deposition method, and an ion plating method. In view of mass production, the sputtering method is most suitable. A TFT in which an amorphous transparent oxide thin film containing In, Ga, Zn, and O is used as the active layer can be manufactured at a temperature equal to or lower than 140° C. by the sputtering method.

It is preferable that a compound such as In—Ga—Zn—O, In—Ga—Zn—Sn—O, Ga—Zn—Sn—O, In—Sn—Zn—O, In—Zn—O, or In—Sn—Sb—O be used as a material for the amorphous transparent oxide thin film to form the active layer of the semiconductor device.

With respect to the material for the amorphous transparent oxide thin film, at least one kind of impurity selected from the group consisting of Sn, Al, Sb, Cd, Ge, P, As, N, and Mg can be added to a compound containing In, Ga, Zn, and O.

A preferred mode is that the amorphous transparent oxide thin film is formed in an atmosphere containing an oxygen gas without intentional addition of an impurity ion for increasing the electrical resistance of the film.

In a case where the transparent semiconductive amorphous In—Ga—Zn—O oxide thin film is used as the channel layer of the TFT, when the electron mobility exceeds 1 cm$^2$/(V·seconds), preferably exceeds 5 cm$^2$/(V·seconds) and the electron carrier concentration is lower than $10^{18}$/cm$^3$, preferably lower than $10^{16}$/cm$^3$, the current flowing between the drain and source terminals in an off state (i.e., when no gate voltage is applied) can be lower than 10 microamperes, preferably lower than 0.1 microamperes. In a case where the thin film is used, when the electron mobility exceeds 1 cm$^2$/(V·seconds), preferably exceeds 5 cm$^2$/(V·seconds), the saturation current after pinch-off can exceeds 10 microamperes and the current on/off ratio exceeds $10^3$.

When the transparent oxide film is utilized as a channel layer, a preferred mode is to produce a transistor including a gate dielectric film for which SiO$_2$, Al$_2$O$_3$, Y$_2$O$_3$, one of HfO$_2$, HfSiO$_x$, HfSiON, and HfAlO$_x$, or a mixed crystal compound containing at least two of those compounds is used. When a defect exists at the interface between the gate dielectric film and the thin film of the channel layer, the electron mobility reduces and hysteresis occurs in transistor characteristics. Leak current significantly varies with the type of the gate dielectric film. Therefore, it is necessary to select a gate dielectric film suitable for the channel layer. When an $Al_2O_3$ film is used, the leak current can be reduced. When a $Y_2O_3$ film is used, the hysteresis can be made smaller. When an $HfO_2$ film having a high dielectric constant is used, the electron mobility can be increased. When a mixed crystal film is used, it is possible to produce a TFT whose leak current and hysteresis are small and whose electron mobility is large. The formation of the gate dielectric film and the channel layer can be performed at room temperature, so any of the stagger structure and the reverse stagger structure can be formed as the TFT structure.

The example of the amorphous oxide containing In, Ga, and Zn is described. The present invention can be applied to an amorphous oxide containing at least one kind of element selected from the group consisting of Sn, In, and Zn.

When Sn is to be selected as at least one of the constituent elements of the amorphous oxide, Sn can be replaced with $Sn_{1-x}M4_x$, where $0<x<1$, and M4 is selected from the group consisting of Si, Ge, and Zr, each of which is a group IV element whose atomic number is smaller than that of Sn.

When In is to be selected as at least one of the constituent elements of the amorphous oxide, In can be replaced with $In_{1-y}M3_y$, where $0<y<1$, and M3 is selected from the group consisting of B, Al, Ga, and Y, each of which is a group III element whose atomic number is smaller than that of Lu or In.

When Zn is to be selected as at least one of the constituent elements of the amorphous oxide, Zn can be replaced with $Zn_{1-z}M2_z$, where $0<Z<1$, and M2 is selected from the group consisting of Mg and Ca, each of which is a group II element whose atomic number is smaller than that of Zn.

Specific examples of the amorphous material which can be applied for the present invention include an Sn—In—Zn oxide, an In—Zn—Ga—Mg oxide, an In oxide, an In—Sn oxide, an In—Ga oxide, an In—Zn oxide, a Zn—Ga oxide, and an Sn—In—Zn oxide. The composition ratio of the constituent materials is not necessarily set to 1:1. When Zn or Sn is solely used, it may be difficult to produce amorphous phase. However, when In is added, it is easy to produce amorphous phase. For example, in the case of an In—Zn system, the ratio of the number of atoms except oxygen is preferably adjusted to obtain a composition in which the concentration of In is approximately 20 atom % or larger. In the case of a Sn—In system, the ratio of the number of atoms except oxygen is preferably adjusted to obtain a composition in which the concentration of In is approximately 80 atom % or larger. In the case of a Sn—In—Zn system, the ratio of the number of atoms except oxygen is preferably adjusted to obtain a composition in which the concentration of In is approximately 15 atom % or larger.

When a clear diffraction peak is not detected (that is, a halo pattern is observed) in the case where X-ray diffraction is performed on a thin film as a measurement target at a low incident angle such as an incident angle of approximately 0.5 degrees, it can be determined that the thin film is amorphous. When any one of the above-mentioned materials is used for the channel layer of the field effect transistor, the present invention does not exclude that the channel layer contains a constituent material in a microcrystal state.

Hereinafter, examples of the present invention will be described. Each of the following examples is an example in which a TFT using an amorphous transparent oxide thin film for the channel is manufactured on a plastic film substrate.

EXAMPLE 1

An example of fabrication of a TFT using an amorphous In—Ga—Zn—O thin film for a channel is shown in which the channel is formed on a biaxially stretched plastic film substrate such that the direction of a current flowing in the channel of the TFT is nonparallel to the direction in which thermal shrinkage rate of the plastic film substrate is largest. The TFT manufactured on the plastic film substrate is a top gate TFT device and has the same structure as that which is described earlier and shown in FIGS. 1 and 2.

The plastic film substrate to be used is a sheet-like plastic film (biaxially stretched polyethylene terephthalate film produced by TORAY Industries, Inc., whose product name is Lumira, product number is T56, thickness is 125 microns, size is 5 cm square, longitudinal (film longitudinal) thermal shrinkage rate is 1.2, and transverse thermal shrinkage rate is 0.5).

As shown in FIG. 2, a drain electrode and a source electrode is patterned on a film surface by a photolithography method such that the direction in which the thermal shrinkage rate of the plastic film substrate is largest is nonparallel to the direction of a current flowing through the channel of the TFT to obtain an angle θ of 90°. After that, the drain electrode and the source electrode (whose material is Au/Ti and thickness is 45 nm) are formed by a lift-off method.

After that, an In—Ga—Zn—O amorphous oxide semiconductor thin film including microcrystals is deposited on the film substrate by a sputtering method using a polycrystalline sintered material having a composition of $InGaO_3(ZnO)_4$ as a target. Film formation conditions are as follows: Ar: 44 sccm, $O_2$: 1.6 sccm to 1.7 sccm, process pressure: 4.2 mTorr, high-frequency power density: approximately 3.7 W/cm$^2$, substrate temperature: unheated, and film thickness: 50 nm.

Finally, a $Y_2O_3$ film (having a thickness of 140 nm, a dielectric constant of approximately 15, and a leak current density of $10^{-3}$ A/cm$^2$ at an application of 0.5 MV/cm) used as the gate dielectric film is formed by a sputtering method. Then, an Au/Ti film (whose thickness is 45 nm) is formed on the $Y_2O_2$ film and the gate terminal is formed by a photolithography and lift-off method. Thus a top gate TFT using an amorphous In—Ga—Zn—O thin film for the channel is manufactured on the plastic film substrate.

All of the above-mentioned processes are performed under a state in which the substrate is not intentionally heated. Therefore, the temperature measurement is performed using Thermolabel (produced by Nichiyu Giken Kogyo Co., Ltd.). Then, it was found that, when the $Y_2O_3$ film is formed by sputtering, the process temperature reaches approximately 135 degrees. It was determined that this temperature is a maximum temperature in the TFT manufacturing processes. Finally, the film substrate of a 5 cm square bends after a series of temperature cycles. As a result, the central portion thereof was lowered by approximately 1 mm as compared with the edge portion thereof.

Figure 3:
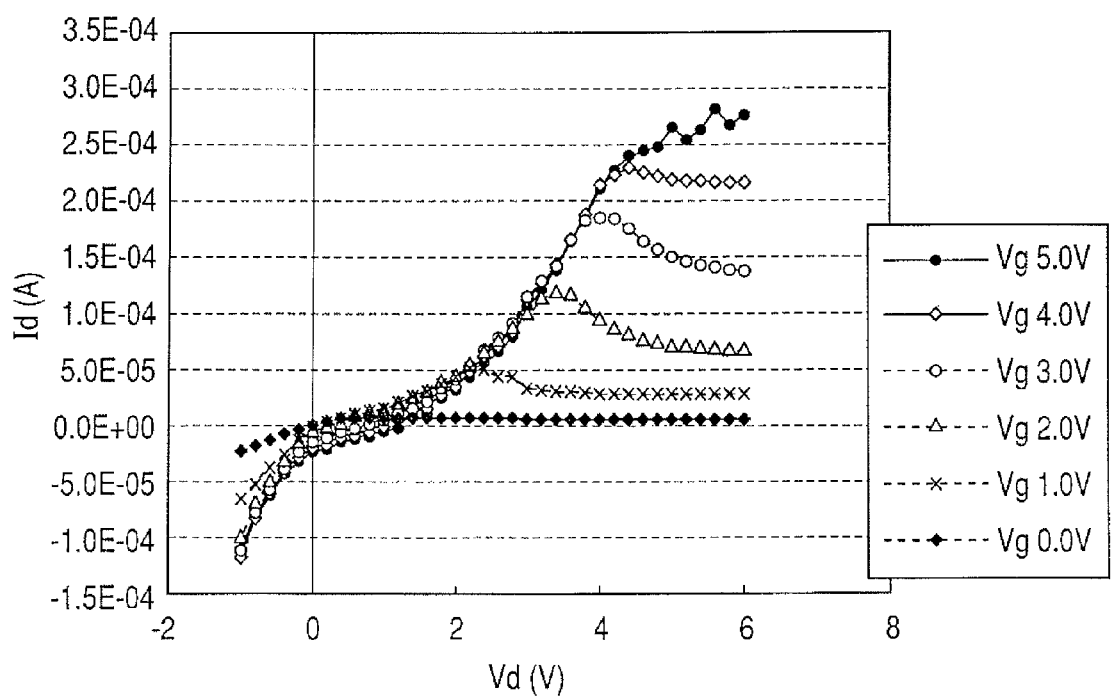
FIG. 3 is a graph showing a current ($I_{DS}$) to voltage ($V_{DS}$) characteristic of the TFT manufactured in Example 1 ($\theta=90°$)
Figure 4:
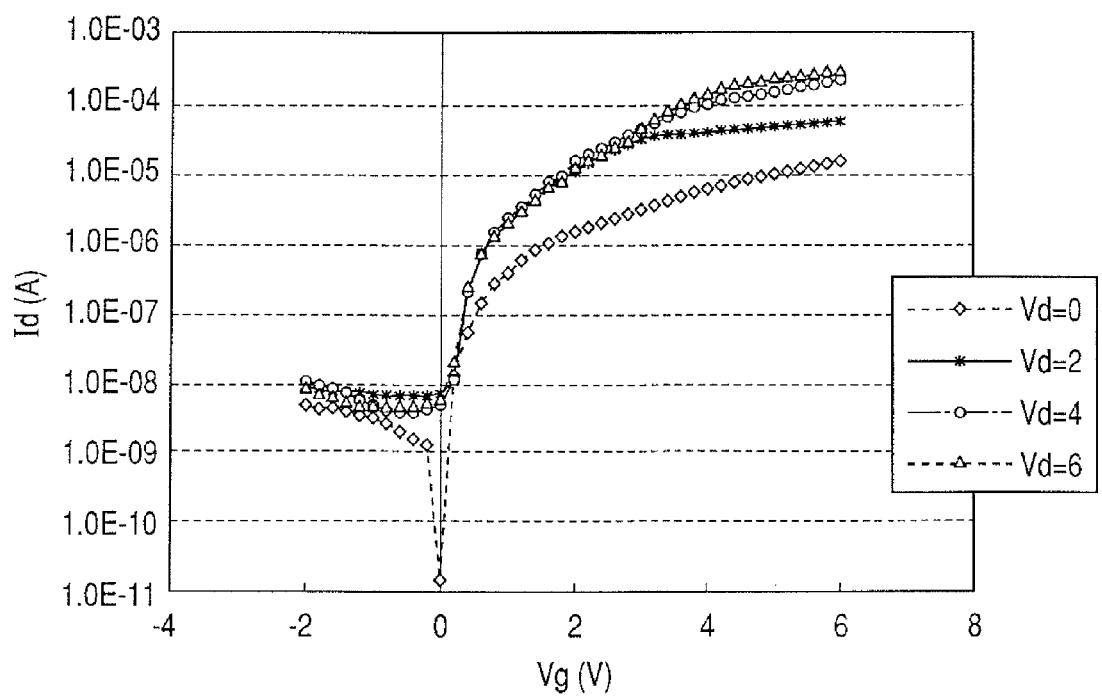
FIG. 4 is a graph showing a current ($I_{DS}$) to voltage ($V_{GS}$) characteristic of the TFT manufactured in Example 1 ($\theta=90°$)

FIG. 3 shows a current ($I_{DS}$) to voltage ($V_{DS}$) characteristic of a TFT device (whose channel length is 3 micron, channel width is 30 micron, and angle θ is 90°) which was measured at room temperature. It is apparent that the channel is an n-type semiconductor because the drain current $I_{DS}$ increases as drain voltage $V_{DS}$ increasing. FIG. 4 shows a current ($I_{DS}$) to voltage ($V_{GS}$) characteristic of the TFT device which was measured at room temperature. The threshold value of a gate voltage $V_{GS}$ at $V_{DS}=6$ V was approximately 0.35 V. At $V_{GS}=6$ V, the current $I_{DS}=2.66\times10^{-4}$ A flowed. This corresponds to the fact that carriers can be induced in the In—Ga—Zn—O amorphous semiconductor thin film including insulating microcrystals by the gate bias voltage. The on/off ratio of the transistor exceeded $5.5\times10^4$. The S-value of the sub-threshold slope characteristics was approximately 0.07 V/dec. The field-effect mobility was calculated from the output characteristics. As a result, the field-effect mobility was found to be approximately 20.3 cm² (V·sec.)$^{-1}$ in the saturation region.

EXAMPLE 2

Figure 5:
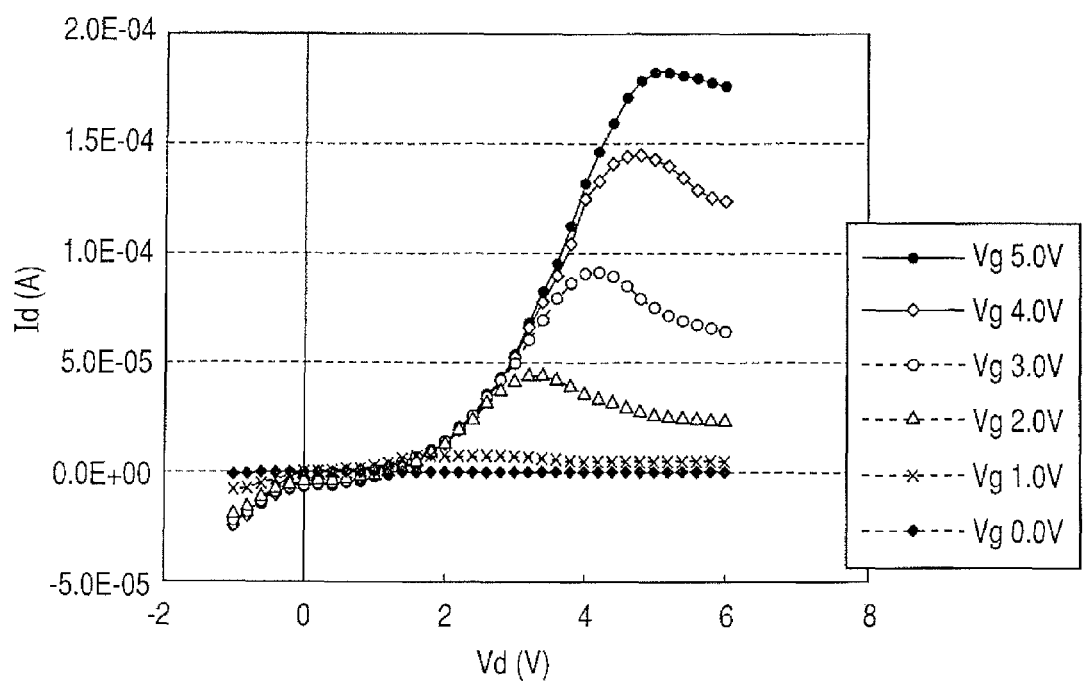
FIG. 5 is a graph showing a current ($I_{DS}$) to voltage ($V_{DS}$) characteristic of a TFT manufactured in Example 2 ($\theta=45°$)
Figure 6:
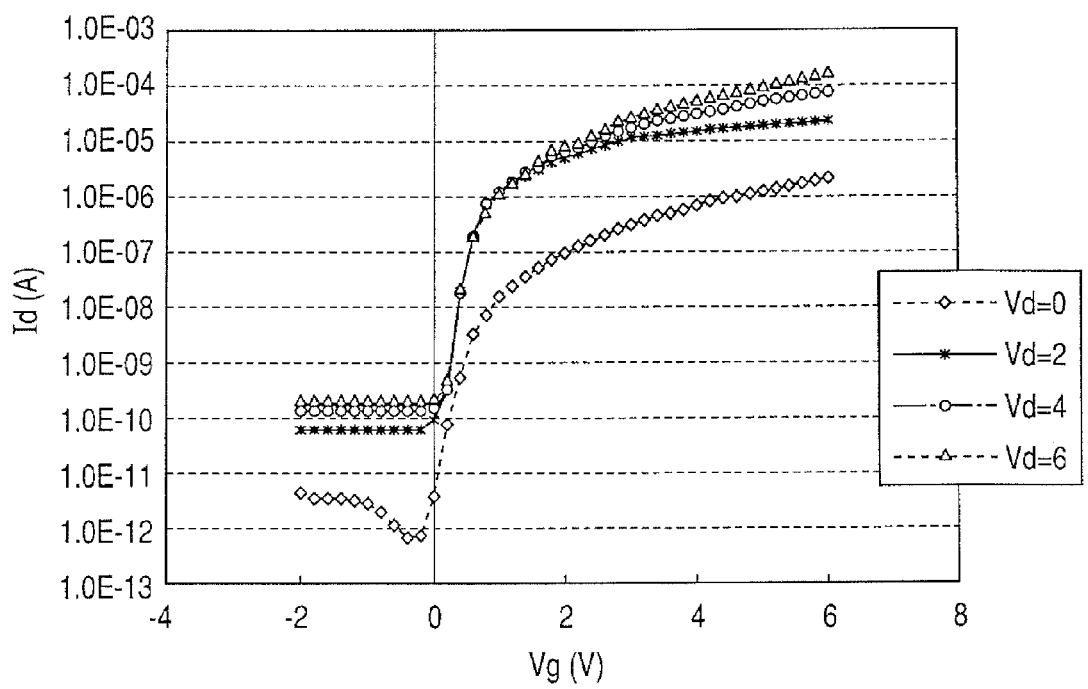
FIG. 6 is a graph showing a current ($I_{DS}$) to voltage ($V_{GS}$) characteristic of the TFT manufactured in Example 2 (θ=45°)

A TFT device having the same size as that in Example 1 is manufactured and the angle θ is set to 45°. FIG. 5 shows a current ($I_{DS}$) to voltage ($V_{DS}$) characteristic of the TFT device (whose channel length is 3 micron, channel width is 30 micron, and angle θ is 45°) which was measured at room temperature. FIG. 6 shows a current ($I_{DS}$) to voltage ($V_{GS}$) characteristic of the TFT device which was measured at the room temperature. The threshold value of the gate voltage $V_{GS}$ at $V_{DS}$=6 V was approximately 0.64 V. At $V_{GS}$=6 V, the current $I_{DS}$=1.83×10$^{-4}$ A flowed. The S-value of the sub-threshold slope characteristics was approximately 0.14 V/dec. The field-effect mobility was calculated from the output characteristics. As a result, the field-effect mobility was found to be approximately 17.1 cm² (V·sec.)$^{-1}$ in the saturation region.

COMPARATIVE EXAMPLE

Figure 7:
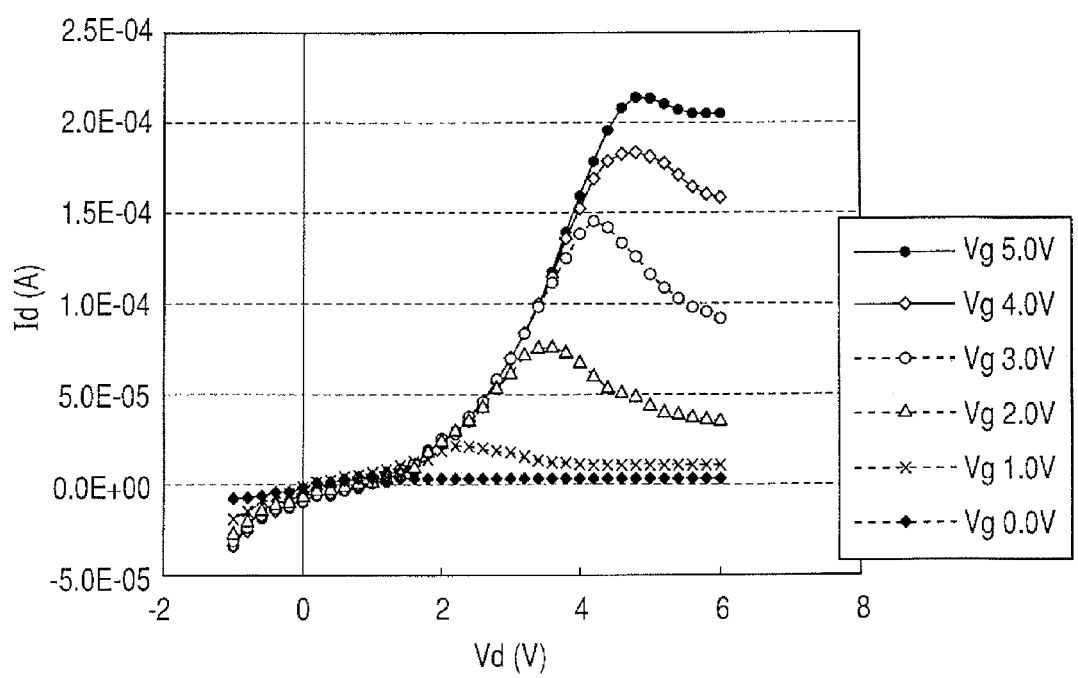
FIG. 7 is a graph showing a current ($I_{DS}$) to voltage ($V_{DS}$) characteristic of a TFT manufactured in Comparative Example (θ=0°)
Figure 8:
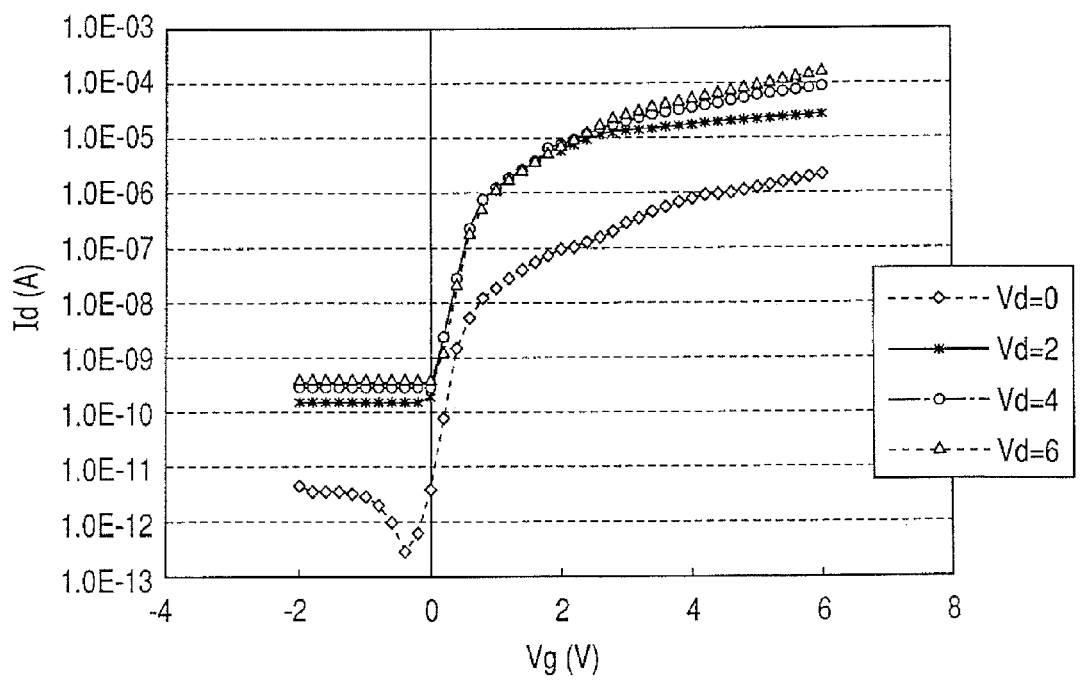
FIG. 8 is a graph showing a current ($I_{DS}$) to voltage ($V_{GS}$) characteristic of the TFT manufactured in Comparative Example (θ=0°).

A TFT device having the same size as that in Example 1 is manufactured and the angle θ is set to 0°. FIG. 7 shows a current ($I_{DS}$) to voltage ($V_{DS}$) characteristic of a TFT device (whose channel length is 3 micron, channel width is 30 micron, and angle θ is 0°) which was measured at room temperature. FIG. 8 shows a current ($I_{DS}$) to voltage ($V_{GS}$) characteristic of the TFT device which was measured at room temperature. The threshold value of the gate voltage $V_{GS}$ at $V_{DS}$=6 V was approximately 0.72 V. At $V_{GS}$=6 V, the current $I_{DS}$=1.69×10$^{-4}$ A flowed. The S-value of the sub-threshold slope characteristic was approximately 0.20 V/dec. The field-effect mobility was calculated from the output characteristics. As a result, the field-effect mobility was found to be approximately 15.6 cm² (V·sec.)$^{-1}$ in the saturation region.

Table 1 shows data obtained by summarizing Examples 1 and 2 and Comparative Example.

TABLE 1

| | θ(°) | On-current (×10$^{-4}$ A) | Mobility (cm² (V·sec)$^{-1}$) | S value (V/dec) | Gate voltage (V) |
|---|---|---|---|---|---|
| Example 1 | 90 | 2.66 | 20.3 | 0.07 | 0.35 |
| Example 2 | 45 | 1.83 | 17.1 | 0.14 | 0.64 |
| Comparative example | 0 | 1.69 | 15.6 | 0.20 | 0.72 |

According to the experimental examples above, it was found that the on-current increases as the angle θ increasing. Note that no any significant change in off-current and leak current $I_{GS}$ were observed.

As described above, when the angle formed between the direction in which the thermal shrinkage rate or the coefficient of thermal expansion of the substrate is largest and the direction of the current flowing in the channel formed in the semiconductor device is set such that these two directions are nonparallel, the mobility of the TFT device can be increased and the S-value of the sub-threshold slope characteristics can be reduced. Here, when the angle is 45° compared to 0° and when the angle is 90° compared to 45°, the mobility of the TFT device can be further increased to reduce the S-value. When the case of 90° is compared with the case of 0°, the mobility of the TFT device can be increased by approximately 30% and the S-value of the sub-threshold slope characteristic can be reduced by approximately 60%. Therefore, the improvement of the transistor characteristic such as an increase in switching speed can be achieved.

The TFT is a normally-off type having such transistor characteristics that the gate current in an off state of the TFT is smaller than 0.1 microamperes and the on/off ratio exceeds 10$^4$. According to the present invention, the TFT transparent to visible light can be produced on a plastic film by a sputtering deposition method.

According to the present invention, it is possible to provide a semiconductor device having stable and uniform electrical characteristics, which is formed on a substrate having anisotropy of thermal shrinkage rate or coefficient of thermal expansion in the in-plane direction of the substrate, a circuit using the semiconductor device, an apparatus using the semiconductor device, and the like.

For example, the present invention can be applied to a TFT in which a transparent oxide film formed on a soft plastic film is used as an active layer of the TFT, and also to application fields including a pixel driver of a flexible display, an IC card for certification, and a product ID tag.

As many apparently widely different embodiments of the present invention can be made without departing from the spirit and scope thereof, it is to be understood that the invention is not limited to the specific embodiments thereof except as defined in the claims.

This application claims priority from Japanese Patent application No. 2005-258269 filed on Sep. 6, 2005, which is hereby incorporated by reference herein.

The invention claimed is:

1. A semiconductor device formed on a substrate surface of a substrate that causes either thermal shrinkage or thermal expansion in in-plane directions of the substrate,
   wherein the substrate comprises a polymer resin and the polymer resin has anisotropy of either a thermal shrinkage rate or a coefficient of thermal expansion when causing either the thermal shrinkage or the thermal expansion,
   wherein the semiconductor device comprises as an active layer an amorphous transparent oxide semiconductor selected from the group consisting of In—Ga—Zn—O, In—Ga—Zn—Sn—O, Ga—Zn—Sn—O, In—Sn—Zn—O, In—Zn—O and In—Sn—Sb—O, and
   wherein the direction in which either the thermal shrinkage rate or the coefficient of thermal expansion of the substrate is largest is nonparallel to the direction of a current flowing through the active layer of the semiconductor device.

2. A semiconductor device according to claim 1, wherein the substrate is of a plastic film obtained by melt-processing a thermoplastic resin in a sheet shape and biaxially stretching the thermoplastic resin in longitudinal and transverse directions.

3. A semiconductor device according to claim 1, wherein the semiconductor device is of a thin film transistor.

4. A semiconductor device formed on a substrate surface of a substrate that causes either thermal shrinkage or thermal expansion in in-plane directions of the substrate,
   wherein the substrate comprises a polymer resin and the polymer resin has anisotropy of either a thermal shrinkage rate or a coefficient of thermal expansion when causing either the thermal shrinkage or the thermal expansion,
   wherein the semiconductor device comprises as an active layer an amorphous transparent oxide semiconductor selected from the group consisting of In—Ga—Zn—O, In—Ga—Zn—Sn—O, Ga—Zn—Sn—O, In—Sn—Zn—O, In—Zn—O and In—Sn—Sb—O, and wherein a direction in which either the thermal shrinkage rate or the coefficient of thermal expansion of the substrate is smallest is substantially parallel to the direction of a current flowing through the active layer of the semiconductor device.

5. A semiconductor device according to claim 4, wherein the substrate is of a plastic film obtained by melt-processing a thermoplastic resin in a sheet shape and biaxially stretching the thermoplastic resin in longitudinal and transverse directions.

6. A semiconductor device according to claim 4, wherein the semiconductor device is of a thin film transistor.

7. A semiconductor device according to claim 5, wherein the semiconductor device is of a thin film transistor.

* * * * *